United States Patent [19]
Kerstein et al.

[11] Patent Number: 6,021,478
[45] Date of Patent: Feb. 1, 2000

[54] METHOD FOR OPERATING A MICROPROCESSOR AND A BURST MEMORY USING A CHIP ENABLE AND AN OUTPUT ENABLE SIGNAL

[75] Inventors: Scott Martin Kerstein, Redford; William Eugene Gioiosa, Jr., Dearborn Heights, both of Mich.; Terry Eugene Downs, North Wales, Pa.

[73] Assignee: Ford Motor Company, Dearborn, Mich.

[21] Appl. No.: 08/885,886

[22] Filed: Jun. 30, 1997

[51] Int. Cl.[7] .............................. G11C 7/00; G11C 8/00; G11C 11/40
[52] U.S. Cl. ........................... 711/167; 711/154; 365/236
[58] Field of Search ..................................... 711/167, 154, 711/218, 219, 104, 105; 365/239, 233, 236

[56] References Cited

U.S. PATENT DOCUMENTS

| | | | |
|---|---|---|---|
| 4,679,173 | 7/1987 | Sato | 365/233 |
| 5,280,594 | 1/1994 | Young et al. | 711/157 |
| 5,392,239 | 2/1995 | Margulis et al. | 365/233 |
| 5,502,835 | 3/1996 | Le et al. | 711/169 |
| 5,696,917 | 12/1997 | Mills et al. | 710/35 |

*Primary Examiner*—Eddie P. Chan
*Assistant Examiner*—Yamir Encarnación
*Attorney, Agent, or Firm*—Peter Abolins

[57] ABSTRACT

Burst memory transfer from a memory to a microprocessor (CPU) is accomplished using analysis including determining first and second conditions. If an output enable is consecutively activated for more than one consecutive system clock cycle, following the address phase, the memory will initiate a burst transfer sequence. The addresses of subsequent data bytes or words following the first byte or word are determined by the memory advancing or incrementing its internal address counter until the burst transfer has been suspended or terminated. If the output enable pin is deactivated prior to the next address phase requested by the CPU, burst transfer will be suspended until the output enable pin is activated again. If the CPU requests the next address phase (chip enable activated) from the memory while the output enable is activated, the burst in progress will be terminated.

2 Claims, 5 Drawing Sheets

METHOD FOR OPERATING A MICROPROCESSOR AND A BURST MEMORY USING A CHIP ENABLE AND AN OUTPUT ENABLE SIGNAL

BACKGROUND OF THE INVENTION

1. Field of the Invention

This invention relates to the operation of microprocessors and associated memories.

2. Prior Art

It is known to operate microprocessors in conjunction with associated memories. A microprocessor, or CPU, requests information from the memory. In a typical normal read mode, one data byte or word at a time is obtained from the memory address by the microprocessor. In a typical burst read mode, it is known to obtain more than one data byte or word from multiple memory addresses for the microprocessor. Typically, this requires at least one dedicated burst pin from the microprocessor. Such specialized hardware adds cost and complexity to the semiconductor devices. It would be desirable to overcome and eliminate this problem. These are some of the problems this invention overcomes.

Current burst-mode memories need to interface with dedicated CPU burst signals to support data bursting. These burst signals increase memory chip pin count and logic complexity, thus increasing cost. The purpose of this invention is to show that burst-mode memories can be designed without using dedicated signals to control bursting functions.

Most microprocessors support memory bursting which allows a fast read and/or write of data/instructions over the bus. The advantage of using burst in a computer application is that it eliminates clock cycles between data beats, improving memory access performance. Prior art microprocessors that support a burst-mode require external burst-mode memory to have dedicated control signals to communicate with the CPU during the burst transfer.

For memory read operations using a prior art method for a burst read, the address phase begins when the desired memory address provided by the CPU is latched on the address bus, which occurs when the memory device is activated by a chip enable signal (see FIGS. 2 and 4).

The data phase follows the address phase by at least zero wait states depending on CPU-type and system clock frequency. For prior art Method 1 (FIGS. 1 and 2), the burst transfer begins when the memory receives a dedicated control signal (BURST) from the CPU indicating that the next operation will be a burst transfer. The burst transfer terminates when the memory receives another dedicated control signal (BDIP) which indicates that the next subsequent data byte or word is the last data of the burst transfer. For prior art Method 2 (FIGS. 3 and 4), the burst transfer begins while the chip enable (CE) is activated by alternating odd and even addresses using dedicated control signals (A1 and ADV). The burst transfer terminates when the chip enable is deactivated and/or alternating the control signals terminates.

A computer application can have a 512K byte memory device assembly in a predetermined package. The device has dedicated burst control pins (BURST and BDIP) signals to interface with a CPU to control a burst-mode for reading instructions. If a memory design engineer needs to expand the application's memory to 2M bytes, the memory designer will require two additional address pins. Assuming no pins are available with the predetermined package, the design engineer would require the next larger size package, to add the additional two address pins required for the memory expansion. This would leave a certain number of nonfunctional pins available adding unnecessary cost and complexity to the memory device. It would be desirable to design the memory to use an existing (CE and OE) signal combination to control the burst-mode. The engineer could then remove the dedicated burst control circuitry and make available two extra pins for expanding memory to 2M bytes without adding cost and complexity to the memory design. These are some of the problems this invention overcomes.

SUMMARY OF THE INVENTION

In accordance with the method of this invention, a memory device can be designed such that following the address phase, if the output enable pin has been activated for more than one consecutive clock cycle, the memory will initiate a burst transfer sequence. The address of subsequent data bytes or words following the first byte or word is determined by the memory advancing or incrementing its internal address counter until the burst transfer has been suspended or terminated. If the output enable pin is deactivated prior to the next address phase requested from the CPU, burst transfer will be suspended until the output enable pin is activated again (see FIG. 6). If the CPU requests a different address phase (chip enable activated) from the memory while the output enable is activated, the current burst transfer will be terminated and the next memory cycle will begin. This method can be applied to microprocessors with an asynchronous or synchronous (coincident with the system clock's rising edge) output enable pin.

Existing memory chip enable (CE) and output enable (OE) pins to control bursting of data are used instead of requiring the use of dedicated or special burst control pins (see FIGS. 1, 3 and 5). In accordance with an embodiment of this invention, dedicated burst pins provide the same function when interfaced to a burst-mode memory. The burst-mode memory device can be designed in such a way to use only chip enable and output enable to initiate the burst sequence, reducing design cost and logic complexity by eliminating the dedicated burst pins.

DETAILED DESCRIPTION OF THE INVENTION

Figure 1:
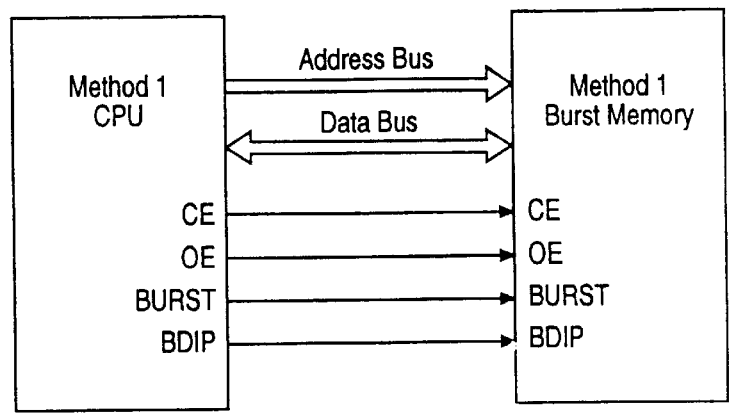
FIG. 1 is a block diagram of a CPU and burst-memory and associated information pass in accordance with Method 1 prior art.
Figure 2:
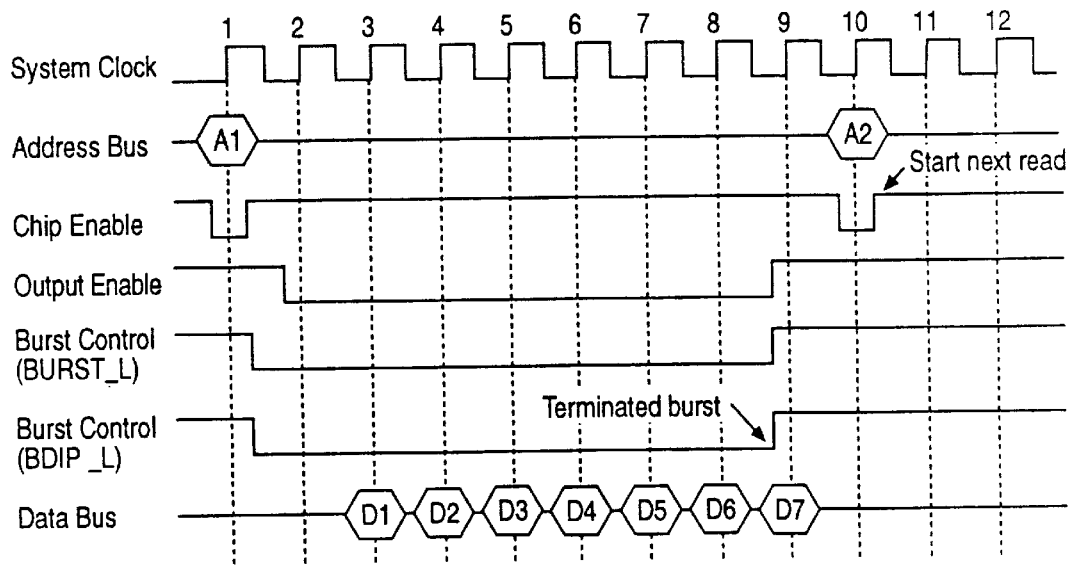
FIG. 2 is a timing diagram for burst transfer in accordance with Method 1 prior art.
Figure 3:
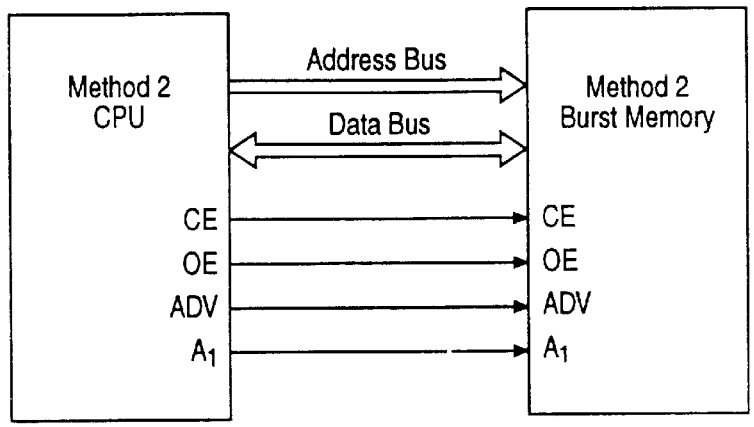
FIG. 3 is a block diagram of a CPU and burst-memory and associated information pass in accordance with Method 2 prior art.
Figure 4:
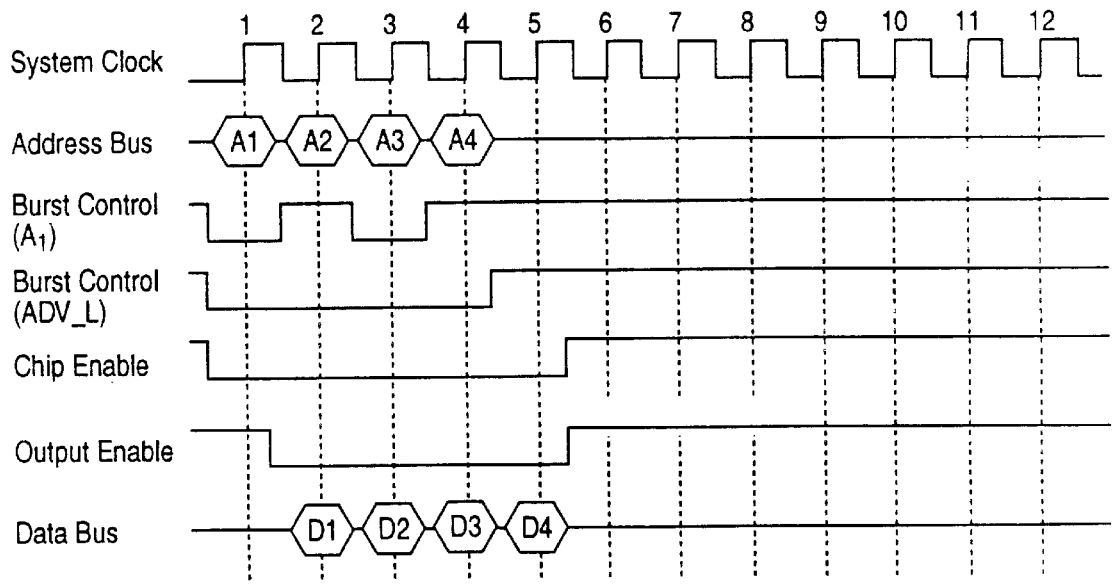
FIG. 4 is a timing diagram for burst transfer in accordance with Method 2 prior art.
Figure 5:
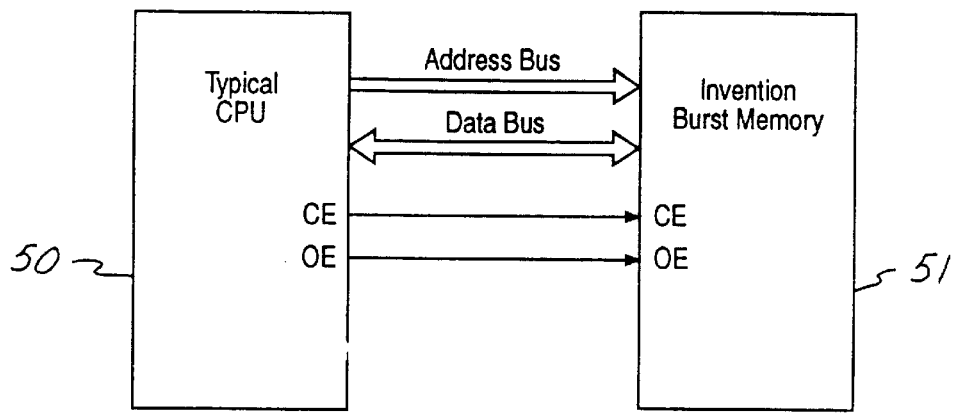
FIG. 5 is a block diagram of a CPU and burst-memory and associated information pass in accordance with this invention.
Figure 6:
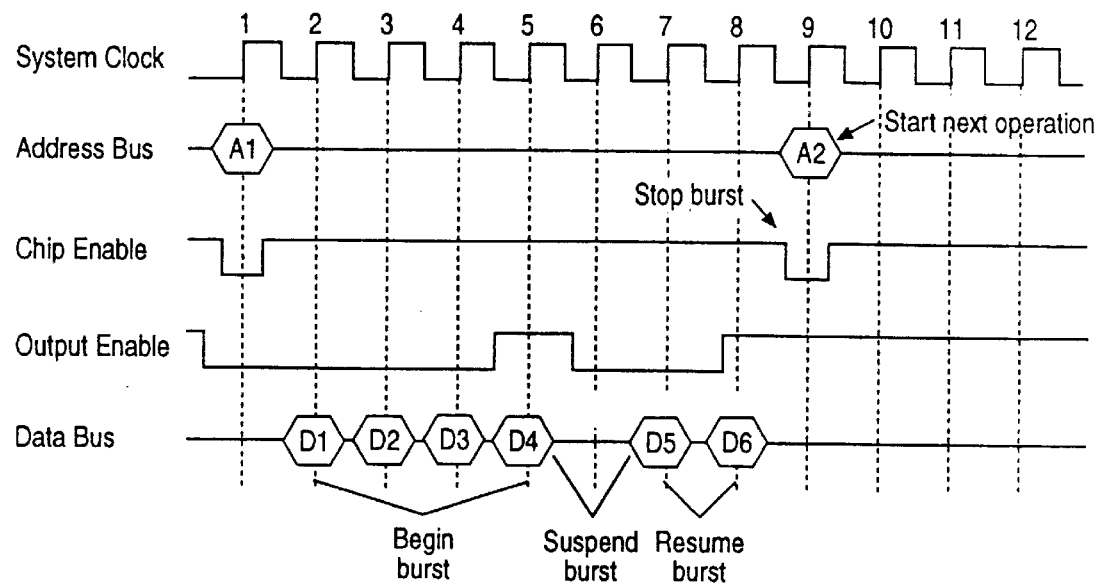
FIG. 6 is a timing diagram in accordance with an embodiment with this invention.

Referring to FIG. 5, a CPU 50 is coupled to a burst memory 51. CPU 50 is coupled to burst memory 51 through an address bus and through ports CE and OE. A data bus is coupled between CPU 50 and burst memory 51 to carry data in both directions.

Figure 7:
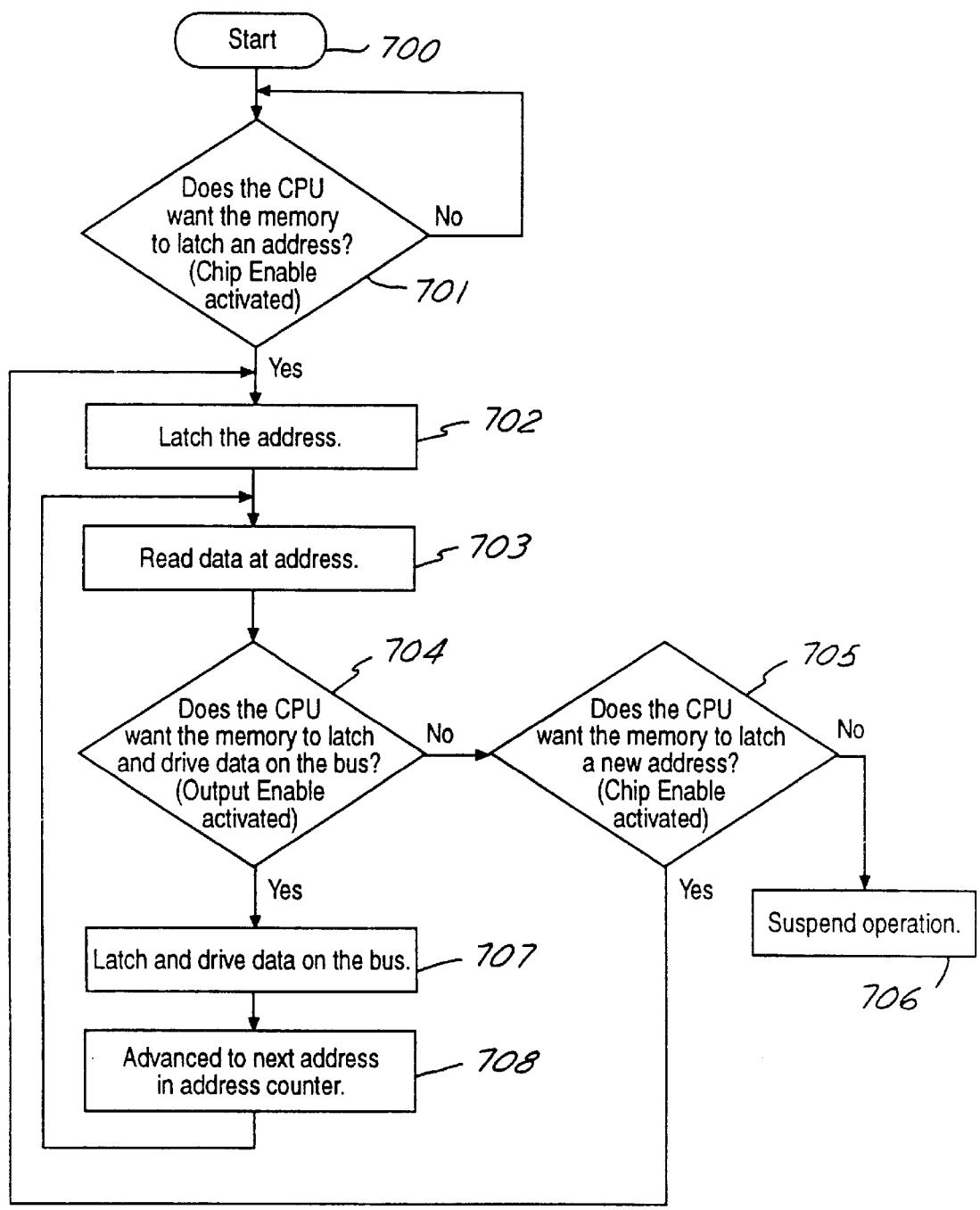
FIG. 7 is a logic flow diagram in accordance with an embodiment of this invention.

Referring to FIG. 7, the inventive flow diagram for burst read transfer begins at a start block 700. Logic flow goes to a block 701 wherein it is asked does the CPU want the memory to latch an address. If no, logic flow proceeds to the input of block 701. If yes, logic flow goes to a block 702 wherein the address is latched on the address bus. Logic flow then goes to a block 703 wherein the data is read at the memory address. Logic flow then goes to a decision block 704 where it is asked does the CPU want the memory to latch and drive data on the data bus. If no, logic flow goes to a decision block 705 wherein it is asked does the CPU want the memory to latch a new address on the address bus. If no, logic flow goes to block 706 wherein operation is suspended. If the answer at block 705 is yes, a logic flow goes to the input of block 702. At block 704, if the answer is yes, logic flow goes to a block 707 wherein there is a latch and drive data on the data bus. The logic flow from block 707 goes to block 708 wherein the memory advances to the next address in the address counter. Logic flow from block 708 goes to the input of block 703.

Figure 8:
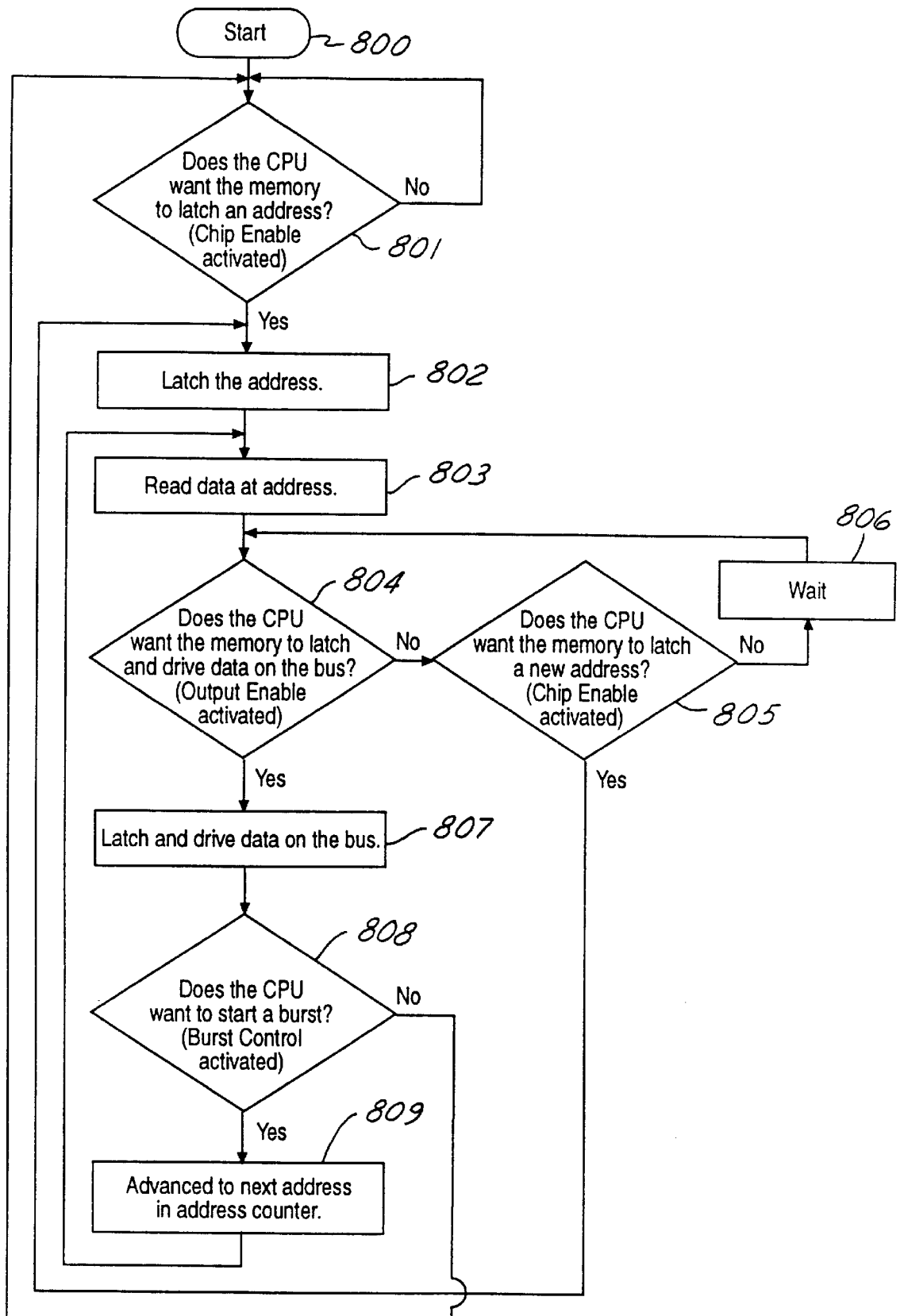
FIG. 8 is a logic flow diagram in accordance with the prior art.

Referring to FIG. 8, a prior art flow diagram for burst read transfer begins at a start block 800 from which logic flow goes to a decision block 801 at which it is asked does the CPU want the memory to latch an address. If no, logic flow goes back to the input of block 801. If yes, logic flow goes to a block 802 where it is noted that the address is latched on the address bus. Logic flow from block 802 goes to a block 803 where the data is read at the address. Logic flow from block 803 goes to a decision block 804 where it is asked does the CPU want the memory to latch and drive data on the data bus. If no, logic flow goes to a decision block 805 where it is asked does the CPU want the memory to latch a new address on the address bus. If no, logic flow goes to a block 806 where logic flow waits until a new address is latched. Logic flow from block 806 goes to the input of decision block 804. If at block 805 the answer was yes, logic flow goes to the input of block 802. If at block 804 the answer is yes, logic flow goes to a block 807 where it is latched and drive data on the data bus. Logic flow from 807 goes to a decision block 808 where it is asked does the CPU want to start a burst transfer. If no, logic flow goes to the input of block 801. If yes, logic flow goes to a block 809 where there is an advance to the next address in the address counter. Logic flow from block 809 goes to the input of block 802.

The logic flow diagram in FIG. 7 is simplified from the logic flow diagram in FIG. 8 by eliminating decision block 808, which activates the burst control. In FIG. 7, the invention uses existing memory CE and OE control pins to initiate and control the burst-mode without the need for additional dedicated burst control pins. Eliminating the use of burst control pins reduces design cost and logic complexity of the burst-mode memory device.

Variations and modifications may be apparent to those skilled in the art. Such variations and modifications which rely upon the disclosure of this invention are preferably considered within the scope of the appended claims.

We claim:

1. A method of operating a microprocessor and memory, including the steps of:

coupling the microprocessor to the memory using a bus, the memory including a memory address counter;

initiating communication between the microprocessor and the memory;

determining a first condition of address phase enable and determining a second condition of output enable activated;

if both said first condition and said second condition are met, then initiating a burst of memory transfer from the memory to the microprocessor;

establishing a plurality of system clock cycles;

consecutively activating the condition of output enable for more than one system clock cycle;

having a burst sequence wherein the memory continues to read and latch data on the bus by advancing to the next address in the memory address counter until the burst sequence is suspended or terminated;

suspending said burst sequence when the output enable is deactivated and a next address phase has not been requested from the microprocessor until the condition of output enable is reactivated; and terminating said burst sequence when the microprocessor desires another address phase, said another address phase being indicated by a chip enable signal.

2. A method of transferring data over a data bus between a microprocessor and a memory, wherein said microprocessor provides addresses to said memory over an address bus, and wherein said microprocessor provides a chip enable signal and an output enable signal to said memory, said method comprising the steps of:

(a) latching an address from said address bus into an address counter in said memory in response to said chip enable signal being active;

(b) driving data retrieved by said memory from said latched address onto said data bus in response to said output enable signal being active;

(c) if said output enable signal remains active and said chip enable signal is inactive, then incrementing said address counter and driving data retrieved from said incremented address onto said data bus;

(d) repeating step (c) as a burst memory transfer as long as said output enable signal is active and said chip enable signal is inactive;

(e) suspending step (c) if said output enable signal and said chip enable signal are both inactive;

(f) resuming step (c) as a burst memory transfer if said output enable signal is reactivated while said chip enable signal is inactive; and (g) terminating step (c) as a burst memory transfer and latching a new address from said address bus into said address counter in response to said chip enable signal being active.

* * * * *